United States Patent [19]
Tanaka et al.

[11] Patent Number: 5,365,167
[45] Date of Patent: Nov. 15, 1994

[54] INTEGRATED CIRCUIT DEVICE HAVING SIGNAL DISCRIMINATION CIRCUIT AND METHOD OF TESTING THE SAME

[75] Inventors: Masahiro Tanaka, Kawasaki; Kazuhiro Tomita, Kasugai; Kazumi Ogawa, Komaki, all of Japan

[73] Assignees: Fujitsu Limited, Kawasaki; Fujitsu VLSI Limited, Kasugai, both of Japan

[21] Appl. No.: 191,451

[22] Filed: Feb. 3, 1994

Related U.S. Application Data

[60] Division of Ser. No. 944,767, Sep. 14, 1992, Pat. No. 5,304,923, which is a division of Ser. No. 789,878, Nov. 12, 1991, Pat. No. 5,168,219, which is a continuation of Ser. No. 429,501, Oct. 31, 1989, abandoned.

[30] Foreign Application Priority Data

Oct. 31, 1988 [JP] Japan .................. 63-275280
Dec. 23, 1988 [JP] Japan .................. 63-325412
Jan. 11, 1989 [JP] Japan .................. 1-4400

[51] Int. Cl.$^5$ ............................ G01R 31/28
[52] U.S. Cl. ............................ 324/158.1; 371/22.5
[58] Field of Search .......... 324/158 R, 158 D, 158 T, 324/133; 371/22.1, 22.5, 22.6; 340/661; 247/48; 437/8

[56] References Cited

U.S. PATENT DOCUMENTS 3,879,662 4/1975 Barneck .................. 324/98
3,883,753 5/1975 Harrison, Jr. et al. .......... 340/661

FOREIGN PATENT DOCUMENTS 0075079 3/1983 European Pat. Off. .
2085171 4/1982 United Kingdom .

OTHER PUBLICATIONS

Patent Abstracts of Japan, vol. 110, No. 3 (E-137), Sep. 14, 1979 & JP-A-54 087 489 (NEC Corp.) Jul. 11, 1979.
Patent Abstracts of Japan, vol. 6, No. 262 (P-164) [1140], Dec. 21, 1982 & JP-A-57 157 164 (Nippon Denshin Denwa Kosha) Aug. 28, 1982.
Patent Abstracts of Japan, vol. 106, No. 9 (E-313), May 10, 1985 & JP-A-59 231 918 (Hitachi Seisakusho K.K.) Dec. 26, 1984.

Primary Examiner—Ernest F. Karlsen
Attorney, Agent, or Firm—Staas & Halsey

[57] ABSTRACT

An integrated circuit device formed on a chip includes a pair of signal input terminals, a signal discriminating circuit having a pair of input terminals coupled to the signal input terminals, for comparing a data signal and a reference signal supplied through the input terminals and for determining whether or not the level of said data signal is higher than that of said reference signal, a pair of test signal terminals to which a predetermined voltage is applied, and a voltage dividing circuit for dividing the predetermined voltage to thereby generate a test signal to be supplied to the signal discriminating circuit through the input terminals.

6 Claims, 6 Drawing Sheets

2

INTEGRATED CIRCUIT DEVICE HAVING SIGNAL DISCRIMINATION CIRCUIT AND METHOD OF TESTING THE SAME

This application is a division of allowed application Ser. No. 07/944,767 filed Sep. 14, 1992, now U.S. Pat. No. 5,304,923, which is a division of allowed application Ser. No. 07/789,878 filed Nov. 12, 1991 and issued as U.S. Pat. No. 5,168,219 on Dec. 1, 1992, in turn a continuation of application Ser. No. 07/429,501, filed Oct. 31, 1989, now abandoned, with respect to which application Ser. No. 07/789,814 was filed Nov. 12, 1991, issuing as U.S. Pat. No. 5,142,222 Aug. 25, 1992.

BACKGROUND OF THE INVENTION

The present invention generally relates to an integrated circuit device having a signal discrimination circuit, and more particularly to an improvement in testing the signal discrimination circuit by use of a very small voltage. Further, the present invention relates to a method of testing the integrated circuit device.

An integrated circuit device having a signal discrimination circuit is known. For example, a signal discrimination circuit is formed by an emitter coupled logic circuit which determines an output logic based on the potential relationship between a pair of input signals, namely, a data signal and a reference signal. When testing such a signal discrimination circuit, it is required to supply the signal discrimination circuit with a pair of test signals having a very small potential difference.

When testing a signal discrimination circuit as described above in a step of production of an integrated circuit device having the signal discrimination circuit, an automatic IC tester having a power source device for use in test, such as a "4145B" tester marketed by YHP or a "T3340" tester marketed by Advantest typically is used. The automatic IC tester can generate a pair of test signals having a very small potential difference. The generated test signals are applied to input terminals of the signal discrimination circuit, and logic levels derived from the signal discrimination circuit are monitored. Then it is determined whether the signal discrimination circuit can operate correctly on the bases of the monitored logic levels.

The aforementioned IC tester "4145B" has the following specification:
i) voltage range: ±20V
ii) precision: ±(0.1% + 10 mV + 0.4Ω × Io)
where Io is an output current. The aforementioned IC tester "T3340" has the following specification:
i) voltage range: ±2V, ±8V
ii) precision: for ±2V, ±(0.2% + 2 mV + 0.6 mV/10mA) for ±8V ±(0.2% + 4 mV + 0.6 mV/10mA)

However, the aforementioned method of testing by such testers has the following disadvantages. The very small test signals are directly supplied to the input terminals of the signal discrimination circuit to be tested. Thus, the test is influenced by any absolute error of the power source device built in the IC tester. Generally, the absolute error of the typical power source device is approximately equal to 2 mV. This value of the absolute error is substantially constant and independent of the magnitude of the output voltage derived from the power source device. When it is assumed that the output voltage derived from the power source device is equal to 10 mV, the ratio of the absolute error to the output voltage is 20% (=(2 mV/10 mV)×100%). Thus, the testing precision is subject to a 20% error. It is noted that even a highly regulated power source device contains an absolute error in the output signals without exception. For this reason, when such a power source device is used in a very narrow voltage range, the ratio of the absolute error to the output is large and thus the testing precision is poor.

SUMMARY OF THE INVENTION

Accordingly, a general object of the present invention is to provide an integrated circuit device having a signal discrimination circuit in which the aforementioned disadvantages are avoided.

A more specific object of the present invention is to provide an integrated circuit device having a signal discrimination circuit in which there is provided a circuit which makes it possible to test the signal discrimination circuit with higher precision.

The above objects of the present invention can be achieved by an integrated circuit device formed on a chip including a pair of signal input terminals, a signal discriminating circuits having an associated pair of input terminals respectively coupled to the pair of signal input terminals, for comparing a data signal and a reference signal supplied through the pair of signal input terminals and for determining whether or not the level of said data signal is higher than that of said reference signal, a pair of test signal terminals across which a predetermined voltage is applied, and a voltage dividing circuit connected to the pair of test signal terminals for dividing the predetermined voltage and thereby generating a test signal which is applied to the signal discriminating circuit through the associated pair of input terminals.

Another object of the present invention is to provide a method of testing the aforementioned integrated circuit device.

This object of the present invention can be achieved by a method of testing an integrated circuit device having the aforementioned structure formed on a chip, comprising the steps of connecting the voltage dividing circuit and the signal discrimination circuit through a switching means, supplying the pair of test signal terminals with a first pair of test signals forming a first potential difference, supplying the signal discriminating circuit with a second pair of test signals having a second voltage difference derived from the voltage dividing means, determining whether the signal discriminating means correctly discerns whether one of the second pair of test signals is higher than the other test signal, and disconnecting the voltage dividing circuit from the signal discriminating circuit by the switching means.

Yet another object of the present invention is to provide a method of generating a pair of signals having a very small potential difference.

This object of the present invention is achieved by a method comprising the steps of applying a first pair of signals input to a pair of signal terminals of an integrated circuit device, which includes signal discriminating which is provided with a data signal and a reference signal and functions for determining whether the level of the data signal is higher than that of the reference signal or not and voltage dividing means which produces a first potential difference by dividing the first pair of signals applied thereto through the pair of signal input terminals, deriving a second pair of signals having a second potential difference less than the first potential difference from the voltage dividing means, and supplying the second pair of signals to the signal discriminating means.

Additional objects, features, and advantages of the present invention will become apparent from the following detailed description when read in conjunction with the accompanying drawings.

DESCRIPTION OF THE PREFERRED EMBODIMENTS

Figure 1:
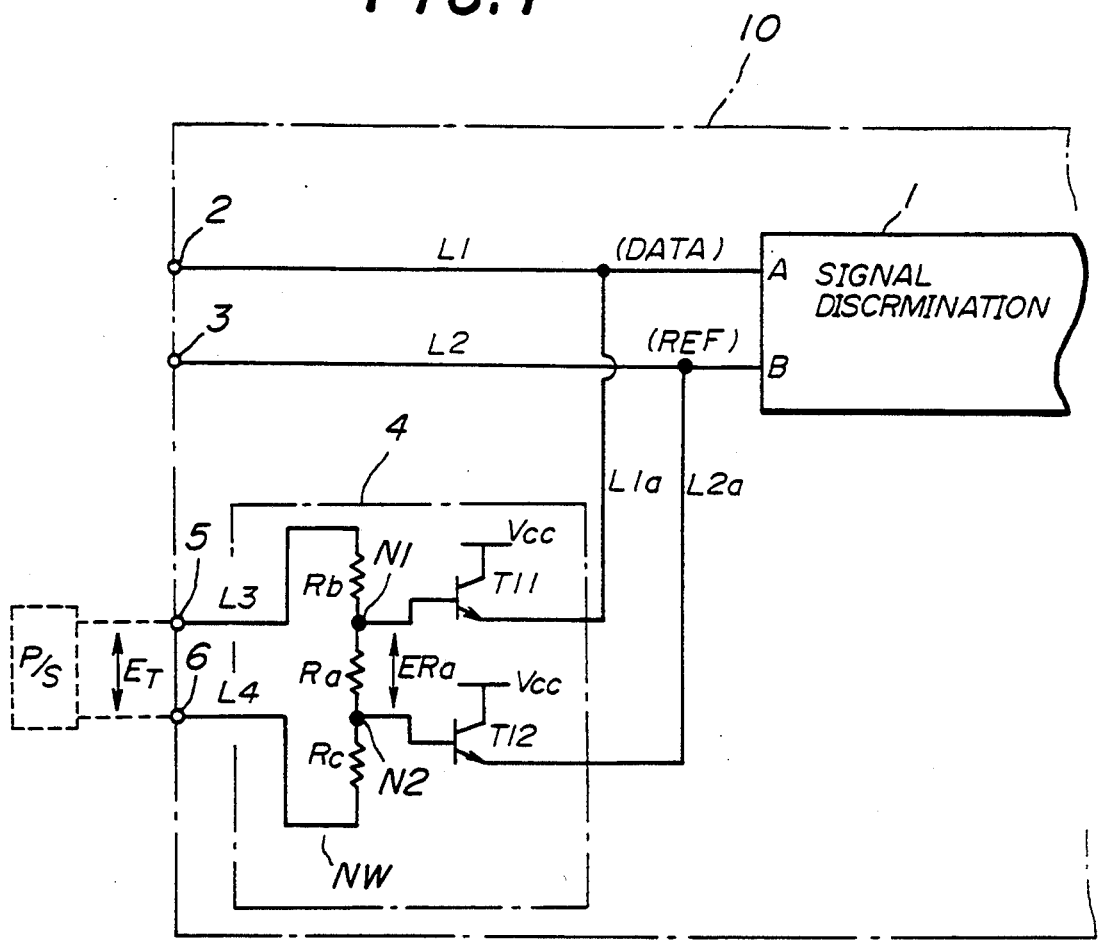
FIG. 1 is a circuit diagram of a first preferred embodiment of the present invention.
Figure 2:
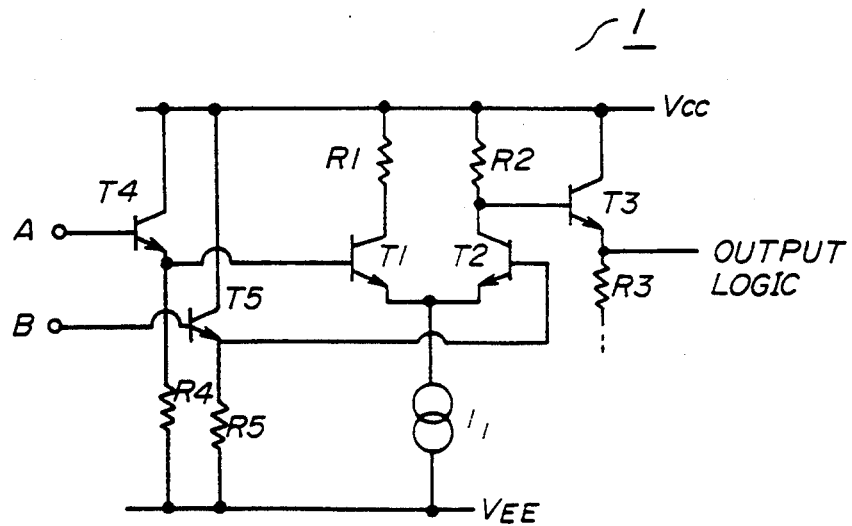
FIG. 2 is a circuit diagram of a signal discrimination circuit used in the circuit shown in FIG. 1.

A description is given of a first preferred embodiment of the present invention with reference to FIGS. 1 and 2.

Referring to FIG. 1, a signal discrimination circuit 1 discriminates a very small signal (data signal) from a signal applied thereto together with a reference signal through signal lines L1 and L2 connected to a pair of signal input terminals (pads) 2 and 3 mounted on an edge of a chip 10, respectively. For example, the signal discrimination circuit 1 is provided in an integrated circuit for use in communications. An example of the structure for the signal discrimination circuit 1 is illustrated in FIG. 2.

Referring to FIG. 2, the signal discrimination circuit 1 is formed by an emitter-coupled logic circuit, which includes emitter-coupled transistors T1, T2, an emitter-follower output transistor T3, emitter-follower input transistors T4, T5, resistors R1, R2, R3, R4 and R5, and a constant current source $I_1$. The signal discrimination circuit 1 sets its output logic to "H (high)" level when a pair of signals applied to the respective input terminals A and B thereof have the potential relationship of A > B. On the other hand, the signal discrimination circuit 1 sets its output logic to "L (low)" level when the signals applied to the terminals A and B have the potential relationship of A < B. Normally, one of the signals applied to the terminals A and B is a reference level (signal), and the other signal is a data signal, which is compared with the reference level signal in order to determine whether the data level is equal to or higher than the reference level. In FIG. 1, the input terminal A is provided with the data signal, and the input terminal B is provided with the reference level signal. Alternatively, the input terminals A and B may be supplied with the reference level signal and the data signal, respectively. The signal discrimination circuit 1 is supplied with a positive power source $V_{CCa}$ and a negative source power $V_{EEa}$.

Turning to FIG. 1, signal lines L1a and L2a branch from the signal lines L1 and L2, respectively. The signal lines L1a and L2a are connected to the emitters of transistors T11 and T12, respectively. The collectors of the transistors T11 and T12 are connected to a positive power source $V_{CC}$, and the bases thereof are connected to the respective, opposite ends of a resistor Ra. The resistor Ra forms a resistor network NW together with resistors Rb and Rc. The ends of the resistor network NW are connected to respective signal lines L3 and L4, which are connected to a pair of test signal terminals (pads) 5 and 6, respectively, mounted on the edge of the chip 10. The resistor network NW and the transistors T11 and T12 form a voltage divider circuit 4.

In operation, the aforementioned IC tester is connected to the test signal terminals 5 and 6, and applies a test voltage $E_T$ across the terminals 5 and 6 defined by a test data signal and a test reference level signal to the test signal. The applied test voltage $E_T$ is divided by the resistors Ra, Rb and Rc of the resistor network NW. When Ra=1, and Rb=Rc=4.5, the voltage division ratio is 10:1. Thus, a voltage of ERa ($=E_T/10$) appears across the resistor Ra. The potential of an end (node) N1 of the resistor Ra is drawn to the signal line L1a through the base and emitter of the transistor T11. Similarly, the potential of the other end (node) N2 of the resistor Ra is applied to the signal line L1b through the base and emitter of the transistor T12. When the characteristics of the transistor T11 are the same as those of the transistor T12, the voltage difference between the signal lines L1a and L2a is equal to the aforementioned voltage ERa. The signal discrimination circuit 1 determines its output logic in accordance with the voltage difference.

It is now considered that a very small voltage equal to 10mV is applied to the device in order to test the signal discrimination circuit 1. Assuming that the voltage division ratio of the resistor network NW is 10:1 as described previously, the IC tester is adjusted so as to output 100 mV ($=10$ mV$\times 10$). For example, when the IC tester has a 0.1% rating error and an absolute error of 2 mV, the 10 mV test signal derived therefrom has a total error $\Delta V$ equal to 2.01 mV ($=10$ mV$\times 0.1\% + 2$ mV), which corresponds to a 20% error. On the other hand, the 100 mV test signal derived from the IC tester has the total error $\Delta V$ equal to 0.21 mV ($=2.1/10$), which corresponds to a 2% error. That is, the test signal can be selected by the voltage division ratio of the resistor network NW so that the test signal is of a voltage higher than the very small voltage necessary for test. It follows that the ratio of absolute error to the test signal output can relatively be reduced. Thus, the very small voltage test signal to be applied to the input terminals A and B of the signal discrimination circuit 1 can be made more precise than the conventional small voltage test signal which is derived from the IC tester and supplied directly to the signal discrimination circuit 1.

One may feel concern about a change of input impedance of the signal discrimination circuit 1 due to the presence of the resistor network NW. However, there is no need of such apprehension because the base-emitter junctions of the transistors T11 and T12 are interposed between the resistor network NW and the signal discrimination circuit 1 in the reverse direction. Additionally, the presence of the transistors T11 and T12 makes it possible to determine the voltage division ratio on the basis of only the resistors Ra, Rb and Rc, and thus without taking into account the input impedance of the signal discrimination circuit 1.

It should be appreciated that the test signal applied to the test signal terminals 5 and 6 is very much larger than the conventional test signal. Such a large test signal is less influenced by noise which is present around signal cables extending from the IC tester.

It is preferable that the resistors Ra, Rb and Rc are formed by diffusion resistors. In actuality, a plurality of diffusion resistors are formed on the chip 10, and some of the diffusion resistors are used for forming the resistor Ra, and some of the diffusion resistors are used for forming the resistor Rb. Similarly, some of the diffusion resistors are used for forming the resistor Rc. It is to be noted that each of the diffusion resistances has almost the same error in resistance since those resistors are produced at the same time by the same process. It is to be further noted that the voltage ERa obtained across the resistor Ra is based on the voltage division ratio by the resistor network and therefore errors in resistance of the resistors Ra, Rb and Rc are cancelled. Thereby, the voltage ERa contains less error. Alternatively, polysilicon resistors can be used for forming the resistors Ra, Rb and Rc.

Figure 3:
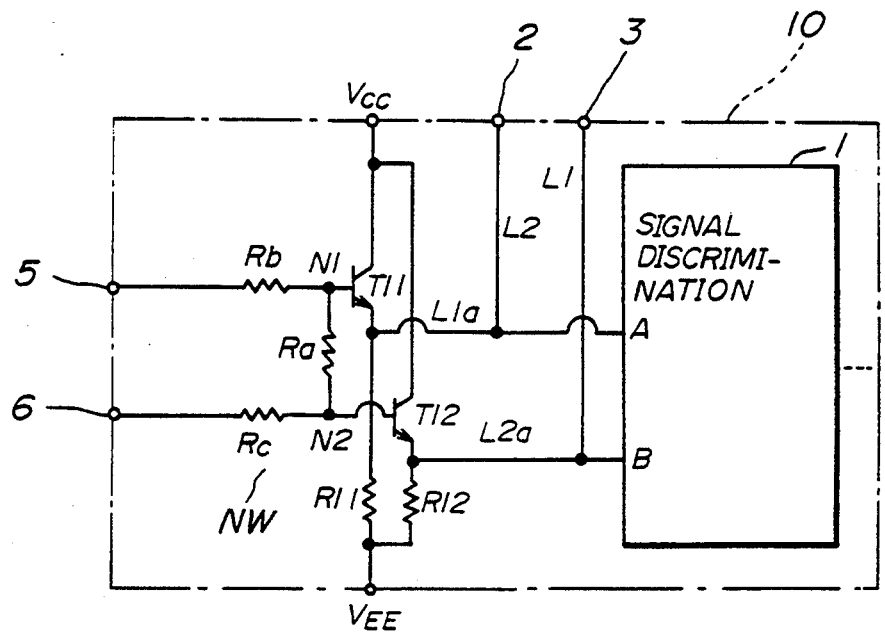
FIG. 3 is a circuit diagram of a second preferred embodiment of the present invention.
Figure 4:
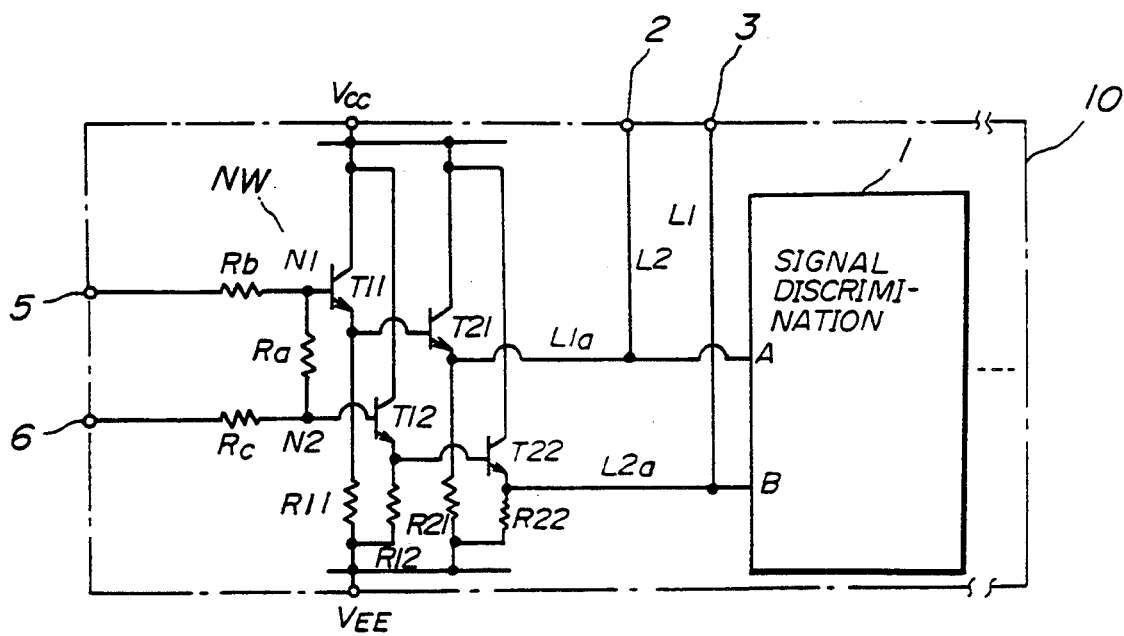
FIG. 4 is a circuit diagram of a variation of the second embodiment shown in FIG. 3.

A description is given of a second preferred embodiment of the present invention with reference to FIG. 3. An essential feature of the second embodiment is that the emitters of the transistors T11 and T12 are connected to a negative power source $V_{EE}$ through resistors R11 and R12, respectively. The second embodiment is effective in the case where the input impedance of the signal discrimination circuit 1 is considerably low. A configuration shown in FIG. 4 is particularly effective in the case where the input impedance of the signal discrimination circuit 1 is extremely low. Referring to FIG. 4, transistors T21, T22, and resistors R21 and R22 are added to the configuration of FIG. 3 so that emitter follower circuits are cascaded by two stages for each of the signal lines L1a and L2a.

In the first and second embodiments, the power sources $V_{CC}$ and $V_{EE}$ may be identical to or different from the power sources $V_{CCa}$ and $V_{EEa}$, respectively. When $V_{CC} > V_{CCa}$ and $V_{EE} < V_{EEa}$, it is possible to set the test signal voltages higher than $V_{CCa}$ and $V_{EEa}$. This setting of the test signal voltages is desirable in view of test environments.

Figure 5:
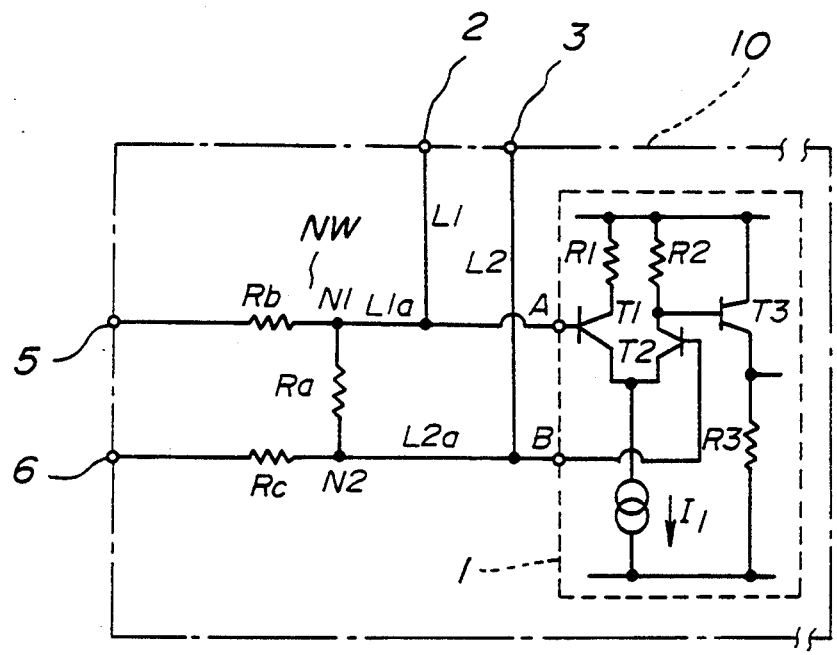
FIG. 5 is a circuit diagram of a third preferred embodiment of the present invention.

A description is given of a third embodiment with reference to FIG. 5, in which those parts which are the same as those in the previous figures are identified by the same reference numerals. The third embodiment is suitable for a case where the signal discrimination circuit 1 has a large input impedance. The third embodiment is especially effective in the case of a signal discrimination circuit 1 which includes an emitter-coupled logic circuit, such as the signal discrimination circuit 1 shown in FIG. 2. The third embodiment is formed by eliminating the transistors T11 and T12 from the configuration shown in FIG. 1 and connecting the ends of the resistor Ra directly to the input terminals A and B of the signal discrimination circuit 1. In the third embodiment, the voltage applied between the input terminals A and B of the signal discrimination circuit 1 is based on the values of the resistors Ra, Rb and Rc. It is necessary to set the resistance of the resistor Ra to a value considerably smaller than the input impedance between the input terminals A and B of the signal discrimination circuit 1.

Table 1 shows values of essential parameters in the third embodiment.

TABLE 1

| Ra | Rb | Rc | R1 | R2 | R3 | I1 |
|---|---|---|---|---|---|---|
| 10Ω | 45Ω | 45Ω | 450Ω | 450Ω | 2 kΩ | 2 mA |

Figure 6:
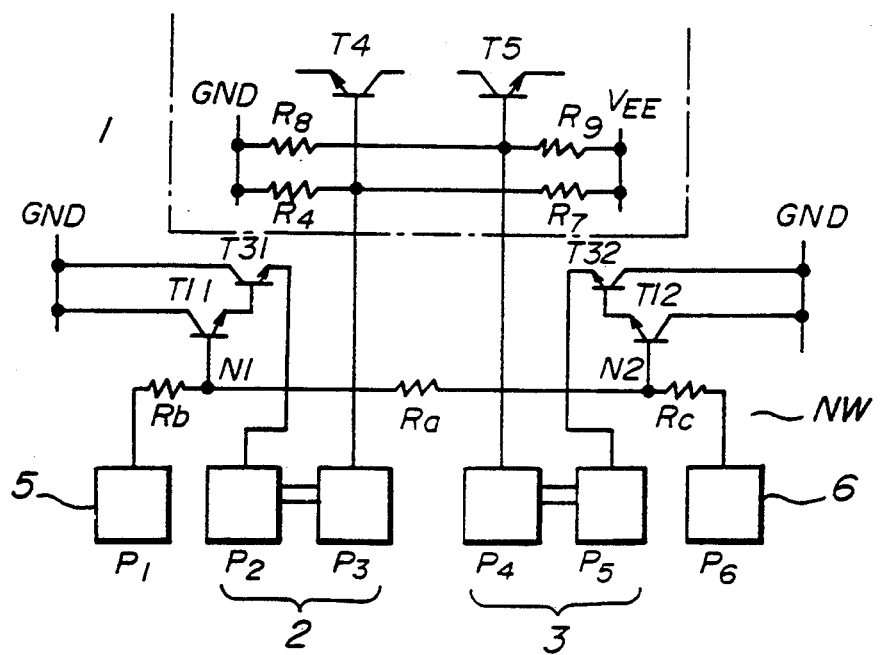
FIG. 6 is a circuit diagram of a fourth preferred embodiment of the present invention.

A description is given of a fourth embodiment of the present invention with reference to FIG. 6, in which those parts that are the same as those shown in the previous figures have the same reference numerals. An essential feature of the fourth embodiment is that transistors T11 and T31 are Darlington-connected, and transistors T12 and T32 are Darlington-connected. The darlington connection is used for minimizing the current drawn from the resistor network NW so that the divided voltage generated across the resistor Ra is not influenced. The collectors of the transistors T11 and T31 are connected to ground, and the collectors of the transistors T12 and T32 are connected to ground. Pads P1 and P6 correspond to the aforementioned terminals 5 and 6, respectively. Pads P2 and P3 correspond to the aforementioned terminal 2. Pads P4 and P5 correspond to the aforementioned terminal 3. The signal discrimination circuit 1 shown in FIG. 6 includes transistors T4 and T5 and resistors R6 through R9. The resistors R6 and R7 are connected to the base of the transistor T4, and the resistors R8 and R9 are connected to the base of the transistor T5.

The transistors T4 and T5 form a current switch. The signal discrimination circuit 1 of the fourth embodiment is tested so as to find characteristics exhibited in a state which slightly deviates from a state where the transistors T4 and T5 pass the same current. In testing, a voltage of 1.01V, for example is applied between the pads P1 and P6, producing a very small voltage of 0.01V across resistor Ra, which voltage is applied to the bases of the transistors T4 and T5 through the transistors T11, T31, T12 and T32 and the pads P2-P5. Thereby, the signal discrimination circuit 1 can be tested by a very small voltage of 0.01V. In this case, Rb=Rc=500Ω, Ra=10Ω, R6=R8=150Ω, and R7=R9=160Ω. Further, the potential of the node (connection) of the resistors Rb and Ra is equal to −0.5V, and the potential of the node of the resistors Ra and Rc is equal to −0.51V. Moreover, the potentials of the bases of the transistors T4 and T5 are equal to −1.9V and −1.91V, respectively.

It is noted that in each of the aforementioned embodiments, the voltage divider circuit 47 including the resistor network NW, is connected in a convention arrangement in which the signal discrimination circuit 1 processes data supplied thereto through the signal input terminals 2 and 3. In this case, the parasitic capacitance of the voltage divider circuit 4, viewed from the signal input terminals 2 and 3, is coupled to the input terminals A and B of the signal discrimination circuit 1. Therefore, there is a possibility that the parasitic capacitance prevents the signal discrimination circuit 1 from operating at high speeds. The fifth embodiment is intended to overcome this problem.

Figure 7:
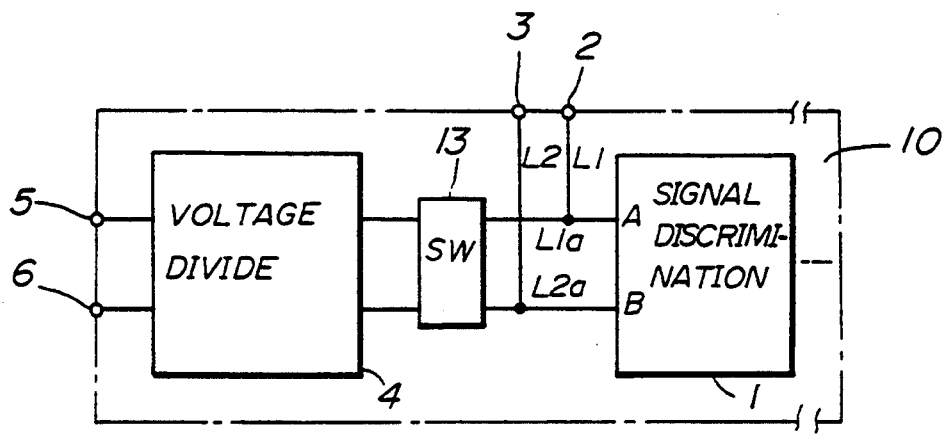
FIG. 7 is a block diagram of a fifth preferred embodiment of the present invention.

A description is given of the fifth embodiment of the present invention with reference to FIG. 7. Referring to FIG. 7, the voltage divider circuit 4 is coupled to the signal discrimination circuit 1 through a switch circuit 13. When the signal discrimination circuit 1 is tested, the switch circuit (SW) 13 connects the voltage divider circuit 4 to the signal discrimination circuit 1. On the other hand, in the ordinary mode, the switch circuit 13 keeps the voltage divider circuit 4 disconnected from the signal discrimination circuit 1.

Figure 8A:
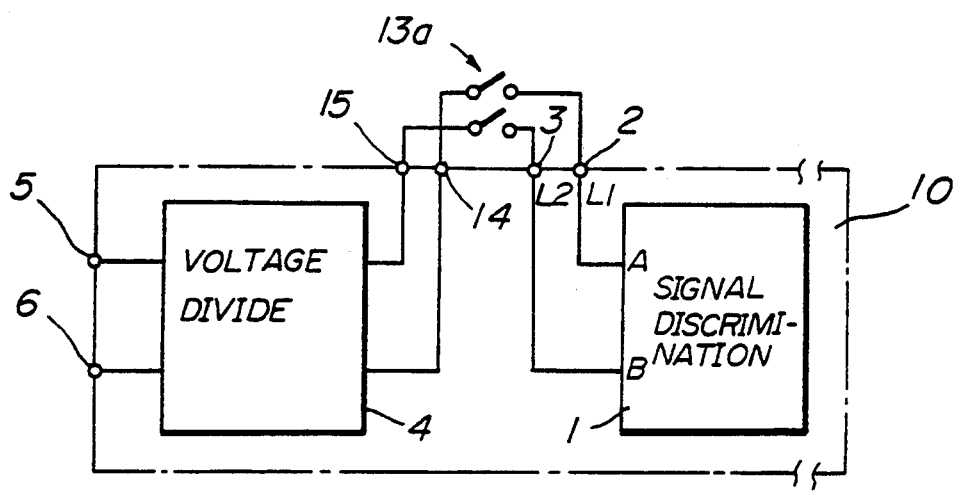
FIGS. 8A, 8B and 8C are block diagrams of first, second and third examples of a switch circuit used in the fifth embodiment shown in FIG. 7.

A first example of the switch circuit 13 shown in FIG. 7 is illustrated in FIG. 8A. Referring to FIG. 8A, the switch circuit 13 is formed by a switch 13a. A first contact of the switch 13a is connected between the signal input terminal 2 and a terminal 14 to which the voltage divider circuit 4 is connected. A second contact of the switch 13a is connected between the signal input terminal 3 and a terminal 15 to which the voltage divider circuit 4 is connected. In the test mode, the first and second contacts of the switch 13a are closed.

Figure 8B:
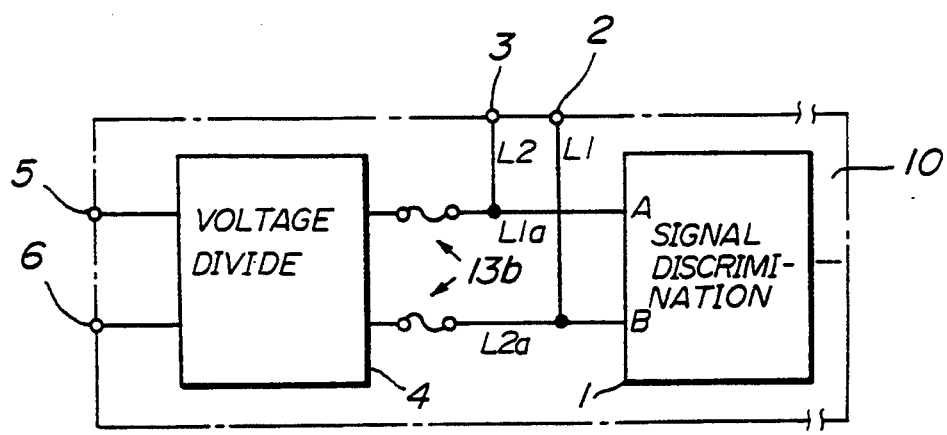

A second example of the switch circuit shown in FIG. 7 is illustrated in FIG. 8B. Referring to FIG. 8B, the switch circuit 13 is formed by a pair of fuses 13b After the signal discrimination circuit 1 is tested, the fuses 13a are melted by passing current from the terminals 5 and 6 so that the voltage division circuit 4 is disconnected from the signal discrimination circuit 1.

Figure 8C:
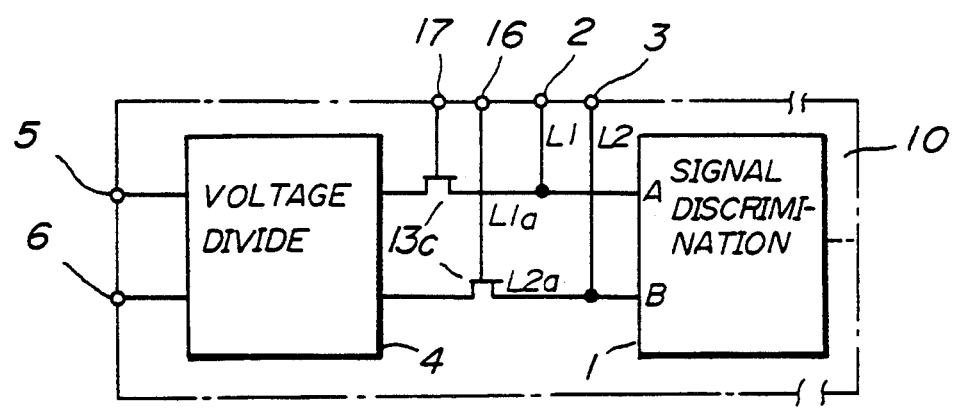

A third example of the switch circuit 13 is illustrated in FIG. 8C. Referring to FIG. 8C, the switch circuit 13 is formed by a pair of FET (MOS) transistors 13c. The gates of the FET transistors 13c are connected to terminals 16 and 17, and the remaining terminals thereof are connected between the voltage divider circuit 4 and the signal discrimination circuit 1. In the test mode, gate signals are applied to the terminals 16 and 17 so that the FET transistors 13c pass signals from the voltage division circuit 4 to the signal discrimination circuit 1.

Figure 9:
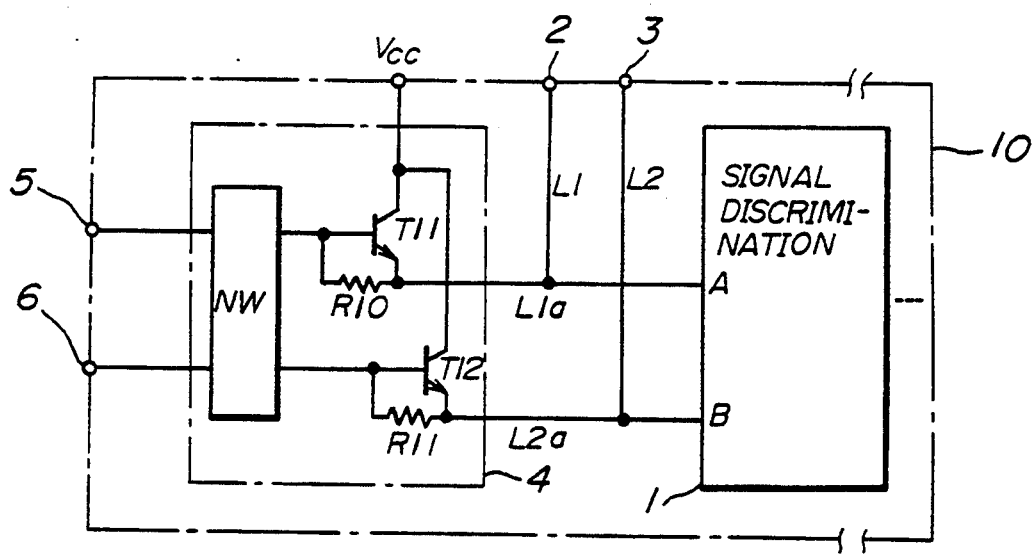
FIG. 9 is a circuit diagram of a sixth embodiment of the present invention.

A description is given of a sixth embodiment of the present invention with reference to FIG. 9. The sixth embodiment is an improvement of the first embodiment shown in FIG. 1. The sixth embodiment is configured by providing resistors R30 and R31 between the bases and emitters of the transistors T11 and T12 of the first embodiment, respectively. The combination of the transistor T11 and the resistor R10 functions as a protection element against electrostatic breakdown. Similarly, the combination of the transistor T12 and the resistor R11 functions as a protection element against electrostatic breakdown. Of course, the transistors T11 and T12 provide the original function as described previously with reference to FIG. 1.

When a high voltage due to a positive charge is applied to the signal input terminal 2 (data), the applied charge passes through the signal line L1, the resistor R30, the base and collector of the transistor T11 and the power source Vcc in this order so that the signal discrimination circuit 1 is protected from high voltage. The transistor T12 and the resistor R31 operate in the same manner when a high voltage is applied to the signal input terminal 3 (reference). In this case, a charge passes through the signal line L2, the resistor R31, the base and collector of the transistor T12 and the power source Vcc in this order.

When a high voltage due to a negative charge is applied to the terminal 2, a high voltage is applied between the collector and base of the transistor T11 through the resistor R30, the line L1 and the terminal 2. Thereby, the collector-base junction of the transistor T11 is broken down so that a base current passes through the transistor T11. Thereby, the transistor T11 is turned ON, which increases the potential of the line L1 up to the power source potential Vcc. In this manner, the signal discrimination circuit 1 is protected from high voltages due to negative charges. The transistor T12 and the resistor R31 operate in the same manner when a high voltage due to a negative charge is applied to the terminal 3.

Figure 10:
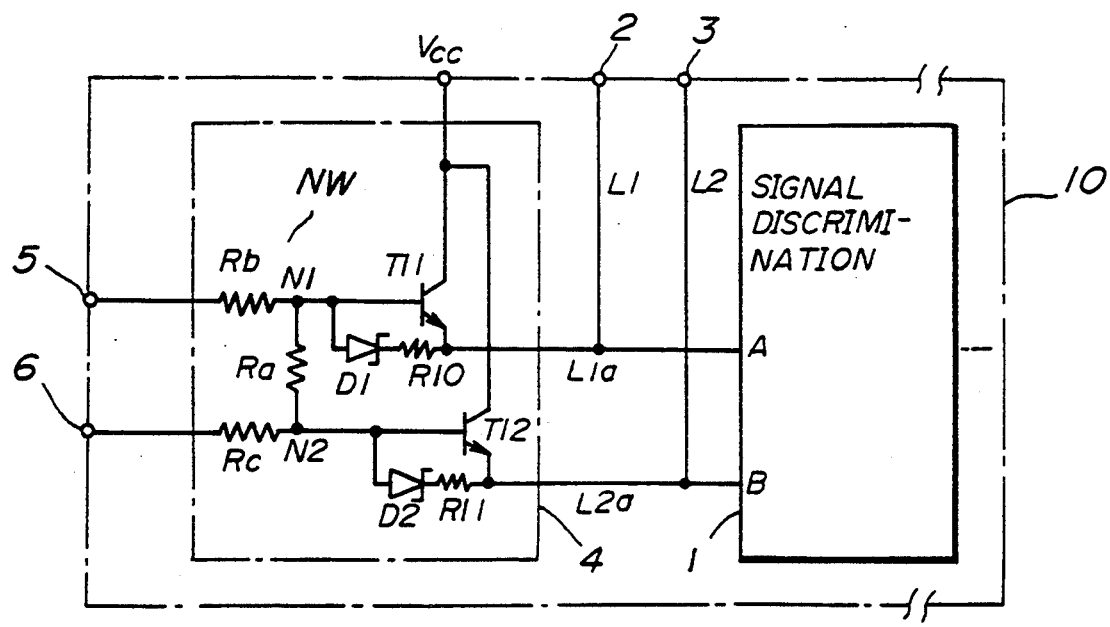
FIG. 10 is a circuit diagram of a variation of the sixth embodiment shown in FIG. 9.

A variation of the sixth embodiment is shown in FIG. 10. An essential feature of the variation is that Schottky diodes D1 and D2 are provided as shown FIG. 10. The anode and cathode of the Schottky diode D1 are connected to the base of the transistor T11 and the resistor R30, respectively. The anode and cathode of the Schottky diode D2 are connected to the base of the transistor T12 and the resistor R31, respectively. The Schottky diodes D1 and D2 help the transistors T11 and T12 turn ON with ease when a high voltage due to a negative charge is applied to the terminals 2 and 3.

The present invention is not limited to the aforementioned embodiments, and variations and modifications may be made without departing from the scope of the present invention.

What is claimed is:

1. A method of testing an integrated circuit device formed on a chip including;
   a pair of signal input terminals,
   signal discriminating means having a pair of input terminals coupled to said signal input terminals, for comparing a data signal and a reference signal supplied through said input terminals and for determining whether or not the level of said data signal is higher than that of said reference signal,
   a pair of test signal terminals to which a first pair of test signals having a first potential difference is applied,
   voltage dividing means for dividing said first potential difference to thereby generate a second pair of test signals having a second potential difference less than said first potential difference, and
   switching means, provided between said voltage dividing means and said signal discriminating means, for selectively connecting said voltage dividing means and said signal discriminating means, said method comprising the steps of:
   connecting said voltage dividing means and said signal discrimination means through said switching means;
   supplying said pair of test signal terminals with said first pair of test signals forming said first potential difference;
   supplying said signal discriminating means with said second pair of test signals having said second voltage difference derived from said voltage dividing means;
   determining whether said signal discriminating means correctly discerns whether one of said second pair of test signals is higher than the other test signal; and
   disconnecting said voltage dividing means from said signal discriminating means by said switching means.

2. A method as claimed in claim 1, wherein said voltage dividing means includes a resistor network composed of a plurality of resistors connected in series, and wherein said resistor network has a pair of nodes through which said second pair of test signals is output, and said nodes are directly connected to said pair of input terminals of said signal discriminating means.

3. A method as claimed in claim 1, wherein said switching means includes switch contacts.

4. A method as claimed in claim 1, wherein said signal discriminating means includes an emitter-coupled logic circuit.

5. A method as claimed in claim 1, wherein said switching means includes fuses.

6. A method as claimed in claim 1, wherein said switching means includes field effect transistors.

* * * * *

UNITED STATES PATENT AND TRADEMARK OFFICE
CERTIFICATE OF CORRECTION

PATENT NO. : 5,365,167
DATED : Nov. 15, 1994
INVENTOR(S) : TANAKA et al.

It is certified that error appears in the above-indentified patent and that said Letters Patent is hereby corrected as shown below:

Col. 2,     line 4, change "signals" to --signal,--;
            line 23, change "circuits" to --circuit,--;
            line 59, after "signals" delete "input"; and after "signal" insert --input--;
            line 60, after "discriminating" insert --means--.

Col. 4,     line 12, after "The" insert --opposite--;
            line 20, after "6" insert --,--;
            line 21, delete "to the";
            line 22, delete "test signal";
            line 27, change "drawn" to --applied--;
            line 36, change "the" to --that--.

Col. 6,     line 15, change "darlington" to --Darlington--;
            line 51, change "47" to --4,--;
            line 52, change "convention" to --conventional--.

Col. 7,     line 37, change "R10" to --R30--.

Signed and Sealed this

Fifteenth Day of August, 1995

Attest:

BRUCE LEHMAN

Attesting Officer      Commissioner of Patents and Trademarks